United States Patent
Grand et al.

(10) Patent No.: US 8,410,242 B2
(45) Date of Patent: Apr. 2, 2013

(54) PULSED DRIVEN DISPLAYS

(75) Inventors: Valerie Grand, Cambridge (GB);
Richard Wilson, Cambridge (GB);
Mark Dowling, Cambridgeshire (GB);
Ilaria Grizzi, Cambridge (GB); Mary J. McKiernan, Cottenham (GB)

(73) Assignees: Cambridge Display Technology Limited, Cambridgeshire (GB); CDT Oxford Limited, Cambridgeshire (GB)

( * ) Notice: Subject to any disclaimer, the term of this patent is extended or adjusted under 35 U.S.C. 154(b) by 1041 days.

(21) Appl. No.: 11/911,651

(22) PCT Filed: Apr. 13, 2006

(86) PCT No.: PCT/GB2006/001376
§ 371 (c)(1),
(2), (4) Date: Sep. 23, 2008

(87) PCT Pub. No.: WO2006/109083
PCT Pub. Date: Oct. 19, 2006

(65) Prior Publication Data
US 2009/0203876 A1 Aug. 13, 2009

(30) Foreign Application Priority Data
Apr. 15, 2005 (GB) .................................. 0507684.9

(51) Int. Cl.
*C08G 73/02* (2006.01)
*C07C 211/55* (2006.01)
*H01L 27/32* (2006.01)
*H01L 51/30* (2006.01)

(52) U.S. Cl. ........................................ 528/422; 564/433

(58) Field of Classification Search .................. 528/422; 564/433
See application file for complete search history.

(56) References Cited

U.S. PATENT DOCUMENTS

| | | |
|---|---|---|
| 5,621,131 A | 4/1997 | Kreuder et al. |
| 5,723,873 A | 3/1998 | Yang |
| 5,798,170 A | 8/1998 | Zhang et al. |
| 6,268,695 B1 | 7/2001 | Affinito |
| 6,309,763 B1 | 10/2001 | Woo et al. |
| 6,353,083 B1 | 3/2002 | Inbasekaran et al. |
| 6,653,438 B1 | 11/2003 | Spreitzer et al. |
| 6,861,502 B1 | 3/2005 | Towns et al. |
| 2004/0158017 A1 | 8/2004 | O'Dell et al. |

FOREIGN PATENT DOCUMENTS

| | | |
|---|---|---|
| EP | 0 707 020 | 4/1996 |
| EP | 0 901 176 A2 | 3/1999 |
| EP | 0 947 123 | 10/1999 |
| EP | 0 949 850 | 10/1999 |

(Continued)

OTHER PUBLICATIONS

Bernius et al., "Progress with Light-Emiting Polymers," *Adv. Mater.*, 13(23):1737-1750 (2000).

(Continued)

*Primary Examiner* — Duc Truong
(74) *Attorney, Agent, or Firm* — Marshall, Gerstein & Borun LLP

(57) ABSTRACT

A pulsed driven display comprising an organic light-emitting device, said device comprising an organic layer comprising a semiconductive polymer, said polymer comprising a fluorene or triarylamine repeat unit, the fluorene or triarylamine repeat unit having a group R pendent from the polymer backbone, wherein R has general formula I:
where $Ar^1$ represents phenyl or a group comprising napthyl; $Ar^2$ represents phenyl or a group comprising napthyl; R' represents a substituent group; R"=H or a substituent; n=0, 1, 2 or 3; m=0 or 1; and n'=1 or 2, with the proviso that m=0 if n=0.

14 Claims, 3 Drawing Sheets

FOREIGN PATENT DOCUMENTS

| | | |
|---|---|---|
| EP | 1 310 539 | 5/2003 |
| EP | 1 394 188 | 3/2004 |
| GB | 2 348 316 | 9/2000 |
| WO | WO-97/05184 | 2/1997 |
| WO | WO-98/10621 | 3/1998 |
| WO | WO-98/57381 | 12/1998 |
| WO | WO-99/48160 | 9/1999 |
| WO | WO-99/54385 | 10/1999 |
| WO | WO-00/53656 | 9/2000 |
| WO | WO-00/55927 | 9/2000 |
| WO | WO-01/19142 | 3/2001 |
| WO | WO-01/62869 | 8/2001 |
| WO | WO-01/81649 | 11/2001 |
| WO | WO-02/084759 | 10/2002 |
| WO | WO-02/092723 | 11/2002 |
| WO | WO-03/000773 | 1/2003 |
| WO | WO-03/095586 | 11/2003 |
| WO | WO-2004/083277 | 9/2004 |
| WO | WO-2004/084260 | 9/2004 |
| WO | WO-2004/106409 | 12/2004 |

OTHER PUBLICATIONS

Hosokawa et al., "Organic Multi-color Electroluminescence Display with Fine Pixels," *Synthetic Metals*, 91:3-7 (1997).

Li et al., "Organic Light-Emitting Materials and Devices," *Optical Science and Engineering Series* (2003), Table on Contents.

Niu et al., "Thermal Annealing Below the Glass Transition Temperature: A General Way to Increase Performance of Light-Emitting Diodes Based on Copolyfluorenes," *Appl. Phys. Lett.*, 81(4):634-636 (2002).

Py et al., "A Passive Matrix Addressed Organic Electroluminescent Display Using a Stack of Insulators as Row Separators," *Synthetic Metals*, 113(1-2):155-159 (2000).

Setayesh et al., "Bridging the Gap Between Polyfluorene and Ladder-Poly-p-phenylene: Synthesis and Characterization of Poly-2,8-indenofluorene," *Macromolecules*, 33(6):2016-2020 (2000).

Yamaguchi et al., "Effect of B and C on the Ordering of $L1_0$-CoPt Thin Films," *Appl. Phys. Lett.*, 79(13):2001-2003 (2001).

Yamamoto et al., "Electrically Conducting and Thermally Stable p-Conjugated Poly(arylene)s Prepared by Organometallic Processes," *Polymer Sci.*, 17:1153-1205 (1993).

Yang et al., "Efficient Blue Polymer Light-Emitting Diodes from a Series of Soluble Poly(paraphenylene)s," *J. Appl. Phys.*, 79(2):934-939 (1996).

International Preliminary Report on Patentability for International Application No. PCT/GB2006/001376, dated Oct. 16, 2007.

International Search Report for International Application No. PCT/GB2006/001376, dated Jul. 6, 2006.

Written Opinion for International Application No. PCT/GB2006/001376, dated Jul. 6, 2006.

Combined Search and Examination Report for Application No. GB0507684.9, dated Jul. 29, 2005.

Passive-matrix

Active matrix

PULSED DRIVEN DISPLAYS

BACKGROUND OF THE INVENTION

1. Field of the Invention

The present invention is concerned with displays, particularly passive matrix displays, driven by pulsed driving conditions. The present invention is further concerned with new semiconductive polymers that may be used in such displays. The present invention is still further concerned with the lifetime properties of semiconductive polymers, and in particular increasing the lifetime of a semiconductive polymer in a display driven by pulsed driving conditions.

2. Related Technology

Many displays consist of a matrix of pixels, formed at the intersection of rows and columns deposited on a substrate. Each pixel is a light-emitting diode (LED), such as a polymer LED (PLED). With reference to FIG. 1, the architecture of an LED comprises a transparent glass or plastic substrate 1, an anode 2 and a cathode 4. An electroluminescent layer 3 is provided between anode 2 and cathode 4.

Coloured displays are formed by positioning matrices of red, green and blue pixels very close together. To control the pixels, and so form the image required, either 'passive' or 'active' matrix driver methods are used.

Active matrix displays incorporate a transistor (TFT) in series with each pixel which provides control over the current and hence the brightness of individual pixels. Lower currents can flow down the control wires since these have only to programme the TFT driver, and the wires can be finer as a result. Also, the transistor is able to hold the current setting, keeping the pixel at the required brightness, until it receives another control signal. DC driving conditions typically are used for an active matrix display.

In passive matrix systems, each row and each column of the display has its own driver, and to create an image, the matrix is rapidly scanned to enable every pixel to be switched on or off as required. The controlling current has to be present whenever the pixel is required to light up.

As described in Proc. of SPIE Vol 2800 (2003) "Organic Light-Emitting Materials and Devices", the principle of passive matrix addressing is rather straightforward and uses the eye's insensitivity to the fast re-positioning of light generation. Instead of simultaneously addressing all the pixels needed to display an image frame, in the passive matrix approach, the different pixels are addressed after each other via a row to row scrolling. The intensity of the short illumination is much more intense than when all the pixels are generating light for the total frame time (the number of rows times the average overall brightness needed). If the refresh rate of the whole frame is high enough, the human eye observes the scrolled picture as a standing picture with an average brightness. The advantage of passive matrix driving is the simple substrate structure allowing for easy customization and low substrate costs. Pulsed driving conditions typically are used for a passive matrix display.

Synthetic Metals 91 (1997) 3-7 and Synthetic Metals 113 (2000) 155-159 provide information on the structure of passive matrix organic LEDs, the contents of which are hereby incorporated by reference. Reference is made in particular to FIG. 11 (c) in Synthetic Metals 91 (1997) 3-7, which shows deposition of the organic emitter layer by evaporation, followed by evaporation of the cathode. Solution deposition (e.g. inkjet printing) of the emitter layer is equally applicable to this structure. The background section of the Synthetic Metals 113 (2000) 155-159 article provides detail on how the cathode is patterned into stripes using a photoresist material.

An important parameter is the lifetime of a display. Inadequate lifetimes are a particular problem for blue light-emitting polymers.

WO 02/092723 and WO 04/083277 are both concerned with blue light-emitting polymers for use in optical devices. Both disclosures refer to blue emissive repeat units comprising an optionally substituted repeat unit of formula:

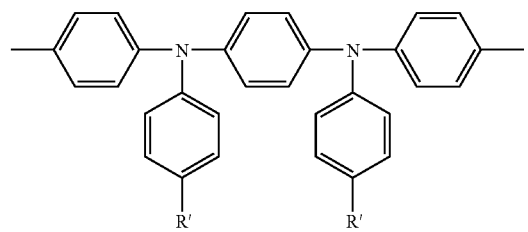

wherein each R' is independently selected from hydrogen or a solubilising group. Particularly preferred solubilising groups are optionally substituted alkyl or alkoxy. Most preferably, R' is n-butyl.

Both disclosures also refer to an optionally substituted repeat unit of formula:

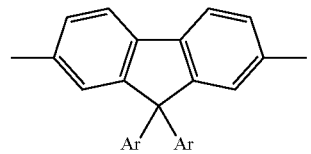

wherein preferably, each Ar is independently selected from the group comprising an optionally substituted residue of formula:

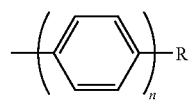

wherein n=1, 2 or 3 and R is a solubilising group or hydrogen. Particularly preferred groups R are hydrogen and optionally substituted alkyl or alkoxy. Most preferably, R is hydrogen or butyl. It is said that by "butyl" is meant n-, sec- or tert-butyl.

In the Examples in WO 02/092723 and WO 04/083277, only polymers P1 to P4 containing 9,9-diphenylfluorene repeat units were made and compared with a comparative polymer where the 9,9-diphenylfluorene repeat units were replaced with 9,9-di-n-octylfluorene repeat units.

WO 02/092723 primarily is concerned with increasing the thermal stability (Tg) of polymers. WO 04/083277 is concerned with improving device lifetime but teaches to omit TFB from the polymer to achieve this. Neither WO 02/092723 nor WO 04/083277 is concerned particularly with pulsed driven devices and neither disclosure even mentions pulsed driven devices.

EP 1394188 is concerned with improving the lifetime of polymer compounds comprising a repeat unit:

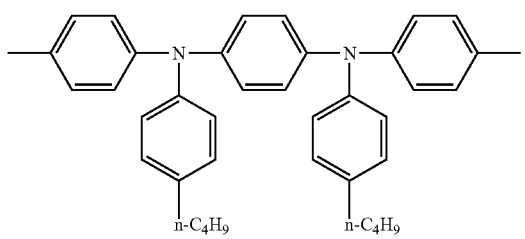

However, EP 1394188 teaches to use a polymer compound comprising a repeating unit shown by formula (1) or (2) on page 4 of EP 1394188 in order to improve the lifetime. In these formulae, the terminal aryl groups ($E_1$, $E_3$, $E_8$ and $E_9$) each has three or more substituents.

According to Proc. Of SPIE Vol 2800 (2003) "Organic Light-Emitting Materials and Devices" lifetime measurements are mostly performed at dc driving. However, it is said that the lifetime of light-emitting materials for passive matrix applications should also be tested using the pulsed driving conditions experienced in full colour displays.

Despite recent advances in the lifetimes of polymers for use in organic light-emitting diodes, there remains a need for alternative polymers for use in pulsed driven and dc driven displays comprising an organic light-emitting diode, preferably polymers with an improved lifetime. In this regard, it is the particular problem of the present invention to improve the lifetime in pulsed driven displays of semiconductive polymers comprising one of the repeat units:

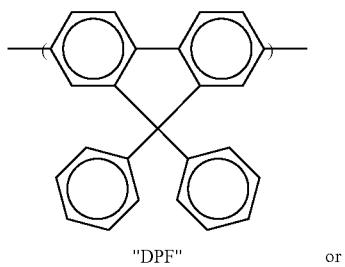

"DPF" or

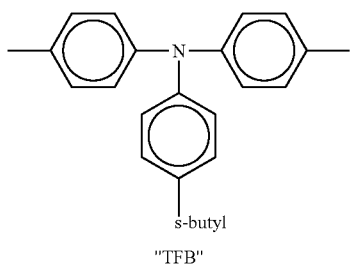

"TFB" or

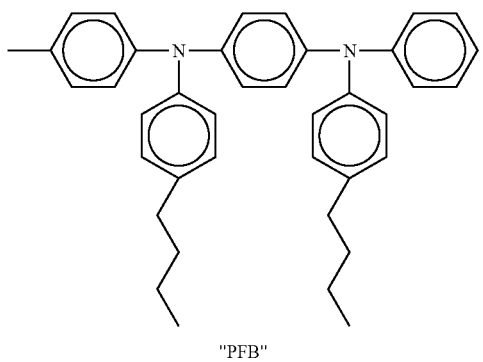

"PFB"

GENERAL DESCRIPTION OF THE INVENTION

The present inventors have solved this problem by providing, in a first aspect of the present invention, a pulsed driven display comprising an organic light-emitting device, said device comprising an organic layer comprising a semiconductive polymer, said polymer comprising a fluorene or triarylamine repeat unit, said fluorene or triarylamine repeat unit having a group R pendent from the polymer backbone, wherein R has general formula I:

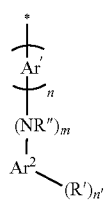

I where $Ar^1$ represents phenyl or a group comprising napthyl; $Ar^2$ represents phenyl or a group comprising napthyl; R' represents a substituent group; R" H or a substituent; n=0, 1, 2 or 3; m=0 or 1; and n'=1 or 2, with the proviso that m=0 if n=0.

In the case where m is 1, $Ar^1$ and $Ar^2$ are preferably phenyl; R" is preferably a substituent, more preferably a substituent of formula:

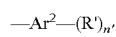

—$Ar^2$—$(R')_{n'}$ wherein $Ar^2$, R' and n' are as defined above. In this case, each occurrence of $Ar^2$, R' and n' in the group R of formula I may be the same or different.

The above defined triarylamine repeat unit in the semiconductive polymer will hereafter be referred to as $T^1$. The above defined fluorene repeat unit in the semiconductive polymer will hereafter be referred to as $F^1$.

The above defined semiconductive polymers have been found to have unexpectedly superior lifetime in pulsed driven displays as compared with the corresponding polymers containing a DPF or PFB repeat unit.

A second aspect of the present invention provides a semiconductive polymer suitable for use in an organic light-emitting device, said polymer comprising a triarylamine repeat unit, the triarylamine repeat unit having a group R pendent from the polymer backbone, wherein R has general formula I:

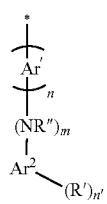

I where $Ar^1$ represents phenyl or a group comprising napthyl; $Ar^2$ represents phenyl or a group comprising napthyl; R' represents a substituent group; R" represents hydrogen or a substituent group; n=0, 1, 2 or 3; m=0 or 1; and n'=1 or 2; provided that when n=0, m=0 and R' represents a branched C4 to C20 alkyl or alkoxy group comprising a tertiary carbon atom.

A third aspect of the present invention provides a monomer for making a semiconductive polymer having general formula II:

$$\text{reactive group-Ar} + N - Ar \xrightarrow{a} \text{reactive group} \quad \text{II}$$
$$\begin{array}{c} | \\ Ar' \\ | \\ \overline{\phantom{X}}_n \\ | \\ (NR'')_m \\ | \\ Ar^2 \\ \diagdown (R')_{n'} \end{array}$$

where $Ar^1$, $Ar^2$, R', R", m, n, and n' are as defined in relation to the second aspect; a=1 or 2; Ar represents an aryl or heteroaryl group; and 'reactive group' represents a reactive group capable of participating in polymerisation; provided that when n=0, R' represents a branched C4 to C20 alkyl or alkoxy group comprising a tertiary carbon atom.

Preferred triarylamine repeat units in the polymer according to the second aspect are as defined in relation to the first aspect for $T^1$.

Preferred further repeat units in the polymer according to the second aspect are as defined in relation to the first aspect for further repeat units in a polymer comprising $T^1$.

Preferred functions or any other feature of a polymer according to the second aspect are as defined in relation to the first aspect for a polymer comprising $T^1$.

Preferred triarylamines in the monomer according to the third aspect are as defined in relation to the first aspect for $T^1$.

The first aspect of the present invention is described further below.

$Ar^1$ may represent napthyl. Preferably $Ar^1$ represents phenyl.

$Ar^2$ may represent napthyl.

Preferably $Ar^2$ represents phenyl.

Preferably R has general formula III:

III (R')_{n'} n is preferably 0 or 1 or 2.
n is preferably 1, 2 or 3.
n is preferably 1 or 2.
When n'=1, R' may be a solubilising group.
When n'=2, one or both R' may be a solubilising group.

The solubilising group may be a C1 to C20 alkyl or alkoxy group. Branched C4 to C20 alkyl or alkoxy groups are preferred. Branched C4 to C20 alkyl groups are more preferred. Branched C4 to C20 alkyl or alkoxy groups comprising a tertiary carbon atom are more preferred. t-Bu is most preferred.

In one embodiment, when n=0 R' represents t-Bu.

When n is greater than 1, each $Ar^1$ may be the same or different.

When n is greater than 1, preferably at least one $Ar^1$ represents phenyl.

When n'=1 and $Ar^2$ represents phenyl, R' is preferably located at the para position. R may have general formula IV:

IV

R'

When n'=1, R' is preferably t-Bu.

When n'=2 and $Ar^2$ represents phenyl, R' are preferably located at the meta positions. R may have general formula V:

V

R'   R'

When n'=2, both R' are preferably t-Bu.

The fluorene repeat unit $F^1$ may have the general formula VI:

VI

R   R where each R independently is as defined above.

The fluorene repeat unit $F^1$ may have the formula VII to XII:

VII
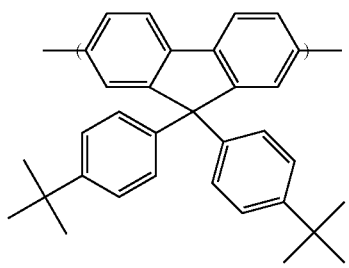
VIII
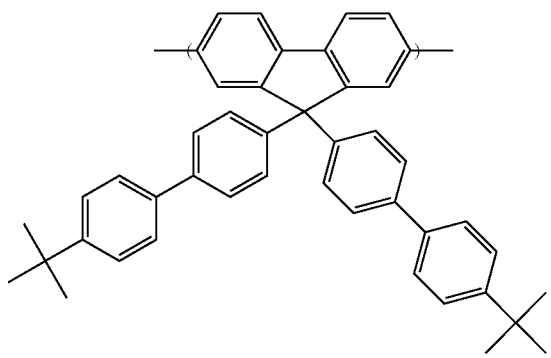
IX
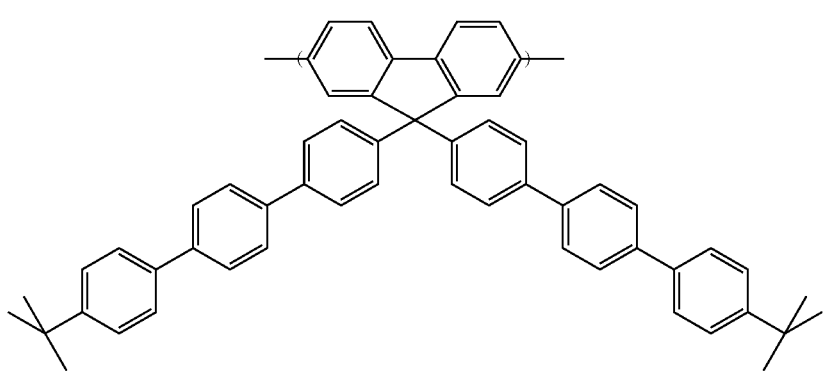
X
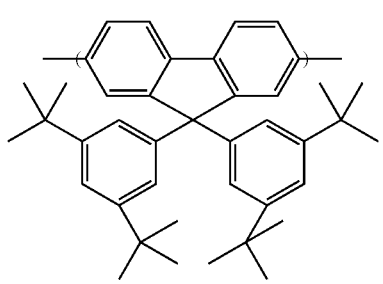
XI
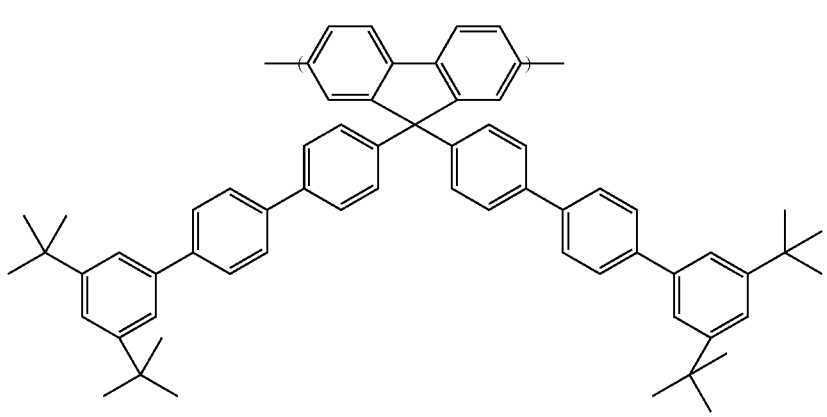

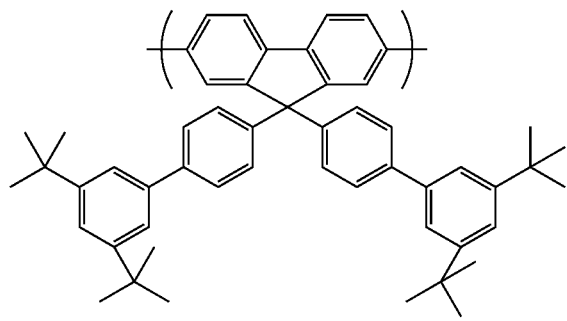

The concentration of F1 may be from 5 to 95 mol %.
The concentration of F1 may be from 20 to 80 mol %.
The concentration of F1 may be from 25 to 55 mol %.
The concentration of F1 may be from 30 to 50 mol %.

The triarylamine repeat unit T1 may comprise a triphenylamine.

The triarylamine repeat unit T1 may have general formula XIII:

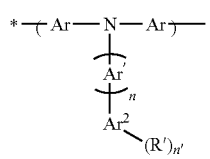

XIII where Ar represents an aryl or heteroaryl group; and $Ar^1$, $Ar^2$, R', n and n' are as defined anywhere in relation to the first aspect.

The triarylamine repeat unit $T^1$ may have general formula XIVa:

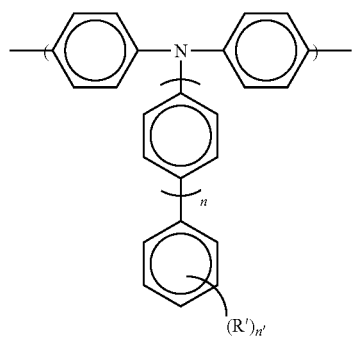

XIVa where R', n and n' are as defined anywhere in relation to the first aspect.

The triarylamine repeat unit $T^1$ may have formula XVa or XVb:

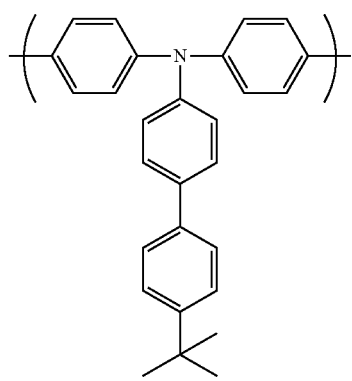

XVa

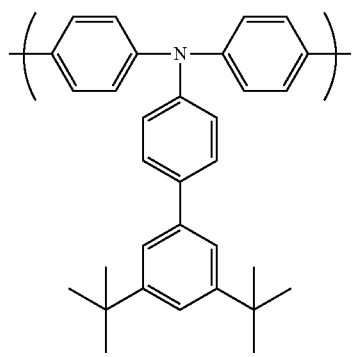

XVb

In the polymer backbone the triarylamine repeat unit $T^1$ may be bonded directly to two further repeat units. The further repeat units may be as defined anywhere herein.

In the triarylamine repeat unit $T^1$, one triarylamine may be bonded directly to another triarylamine giving the formula XVI:

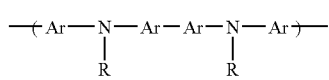

XVI where each Ar and R is as defined above.

In the triarylamine repeat unit $T^1$, a triarylamine may be bonded directly to —N(R)(Ar), giving the formula XVII:

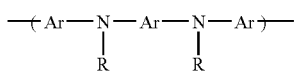

where each Ar and R is as defined above.

Each Ar in formulae XVI and XVII may represent phenyl.

The triarylamine repeat unit $T^1$ may have formula XIVb or XVIII to XXI:

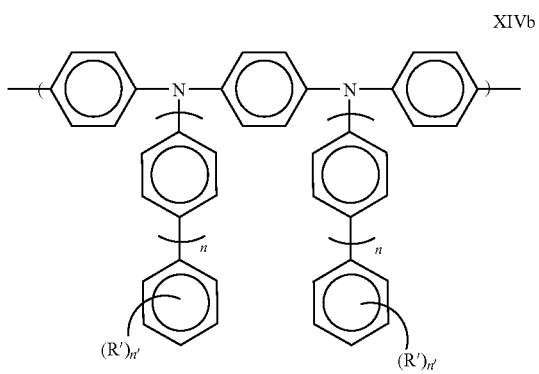

where R', n and n' are as defined anywhere in relation to the first aspect.

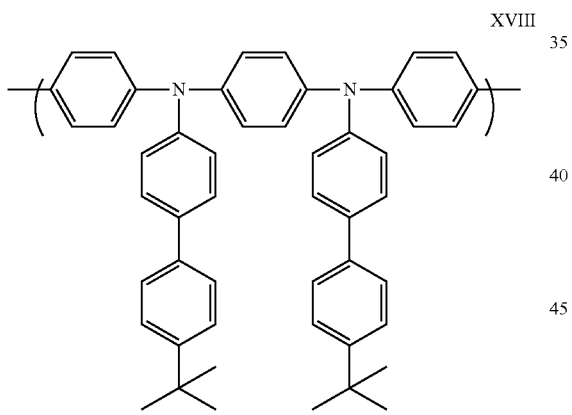

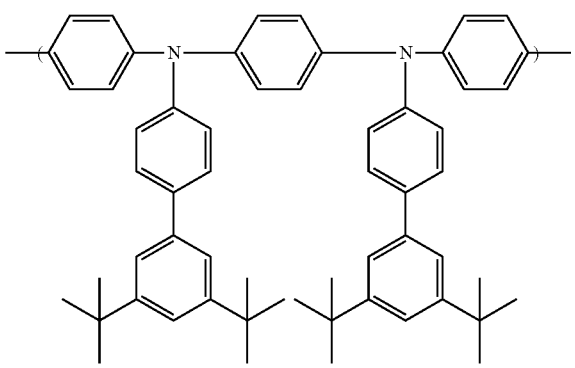

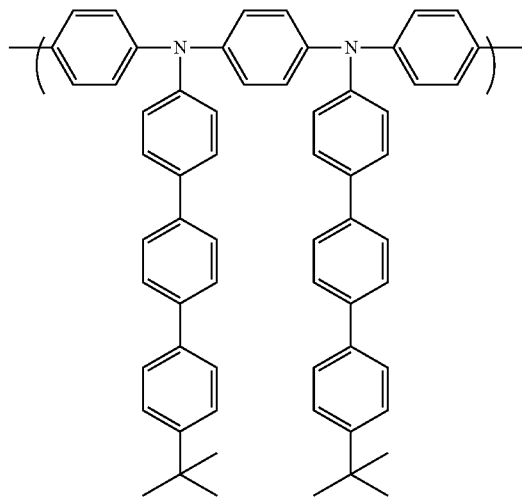

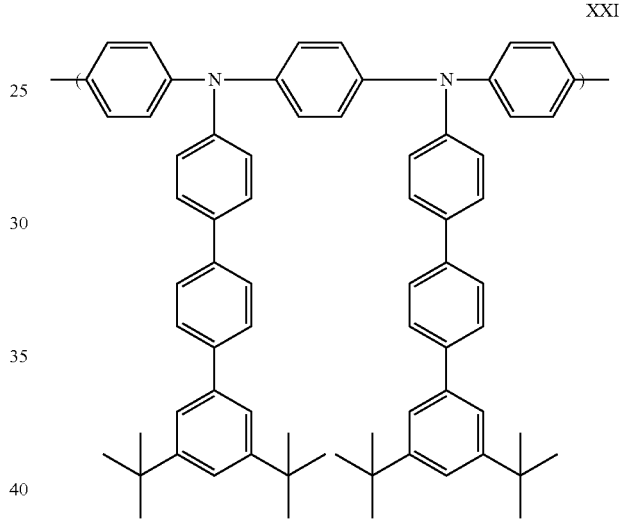

The concentration of $T^1$ may be from 0.5 to 50 mol %.
The concentration of $T^1$ may be from 2 to 15 mol %.
The concentration of $T^1$ may be from 5 to 10 mol %.
The concentration of $T^1$ may be about 5 mol %.

Typically, the semiconductive polymer is conjugated.

The semiconductive polymer comprising $T^1$ and/or $F^1$ may provide one or more of the functions of hole transport, electron transport and emission depending on which layer of the device it is used in and the nature of co-repeat units.

The semiconductive polymer may be blue light-emitting. By "blue light-emitting" is meant an organic material that by electroluminescence emits radiation having a wavelength in the range of 400-500 nm, more preferably 430-500 nm.

A semiconductive polymer comprising a triarylamine repeat unit $T^1$, may be used for emitting light, particularly emitting blue light, and/or for hole transport.

A semiconductive polymer comprising a triarylamine repeat unit $T^1$ and a fluorene repeat unit ($F^1$ or another fluorene unit) may be used for emitting light, particularly emitting blue light, and/or for hole transport.

A semiconductive polymer comprising a fluorene repeat unit $F^1$ and a triarylamine unit ($T^1$ or another triarylamine unit) may be used for emitting light, particularly emitting blue light, and/or for hole transport.

Particularly preferred hole transporting polymers are AB copolymers of a fluorene repeat unit and a triarylamine repeat unit.

A semiconductive polymer comprising a fluorene repeat unit $F^1$ and heteroarylene repeat unit may be utilised for charge transport or emission.

A semiconductive polymer of fluorene repeat units ($F^1$ alone or with other fluorene units) may be utilised to provide electron transport.

The semiconductive polymer may comprise further repeat units in addition to $T^1$ and/or $F^1$. The further repeat units may be selected from arylene repeat units, in particular: 1.4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020.

Further repeat units, which may be present in a semiconductive polymer comprising $T^1$ and/or $F^1$ include further fluorene repeat units, such as 2,7-linked fluorenes, most preferably repeat units of formula XXII:

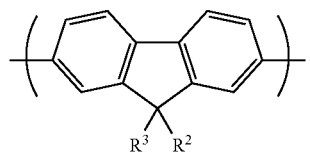

XXII wherein $R^2$ and $R^3$ are independently selected from hydrogen or optionally substituted alkyl, alkoxy, aryl, arylalkyl, heteroaryl and heteroarylalkyl. More preferably, at least one of $R^2$ and $R^3$ comprises an optionally substituted $C_4$-$C_{20}$ alkyl or aryl group.

Preferred further fluorene repeat units are selected from optionally substituted 9,9-dialkyl- or 9,9-dialkoxy-2,7-fluorenyl, more preferably 9,9-di(n-octyl)fluorene.

Further repeat units, which may be present in a semiconductive polymer comprising $T^1$ and/or $F^1$ include further triarylamine repeat units, such as a repeat unit selected from formulae 1 to 6 shown below:

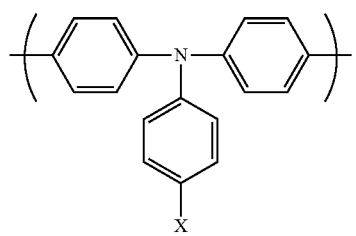

1

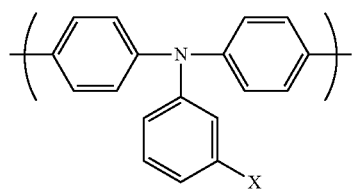

2

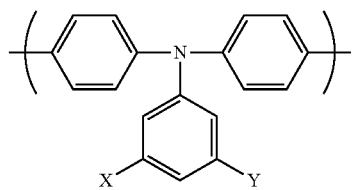

3

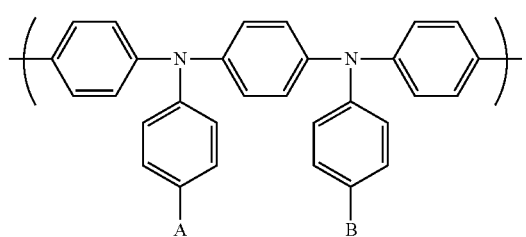

4

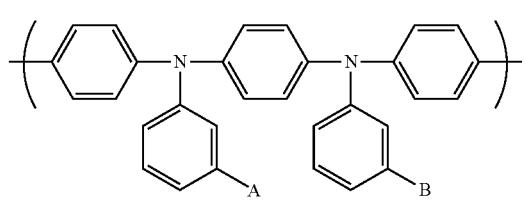

5

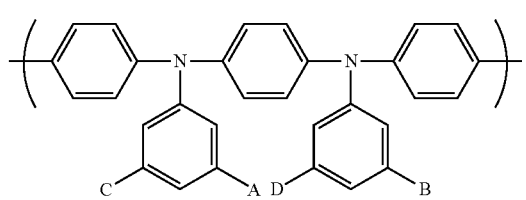

6 wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are $C_{1-10}$ alkyl.

Further repeat units, which may be present in a semiconductive polymer comprising $T^1$ and/or $F^1$ include heteroarylene repeat units. Preferred heteroarylene repeat units are selected from formulae 7-21:

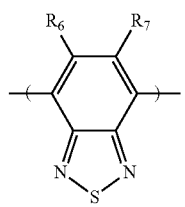

7 wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

8
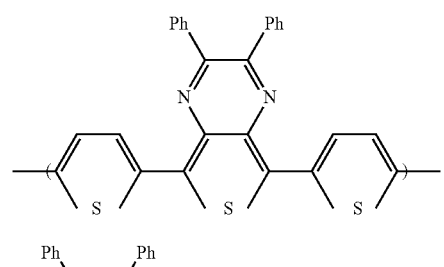
9
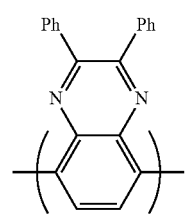
10
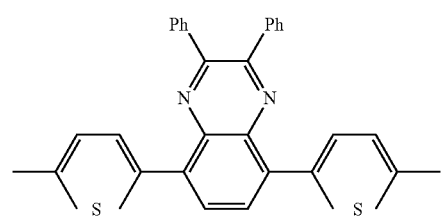
11
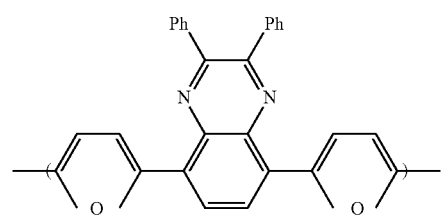
12
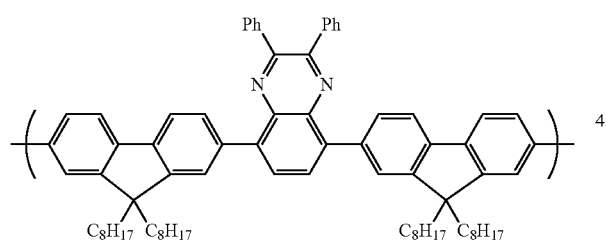
13
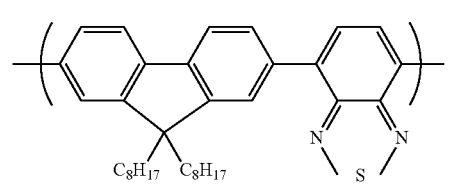
14
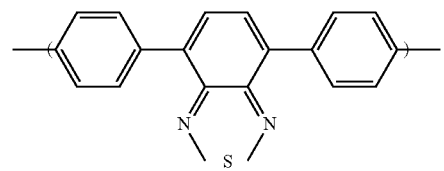
-continued
15
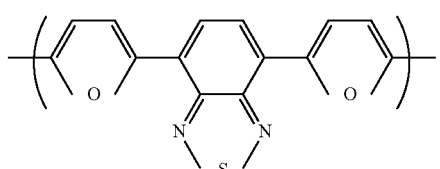
16
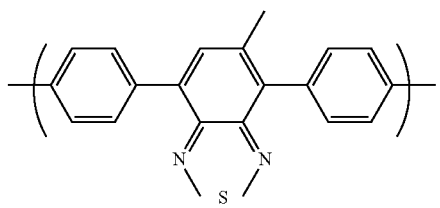
17
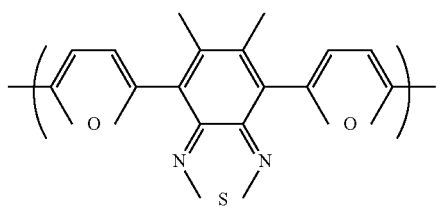
18
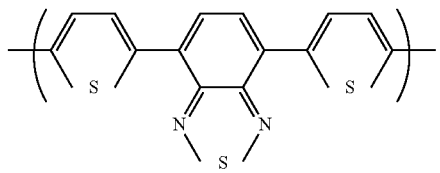
19
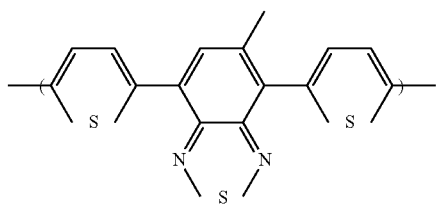
20
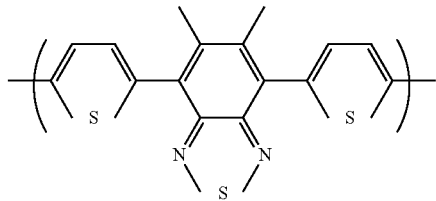
21
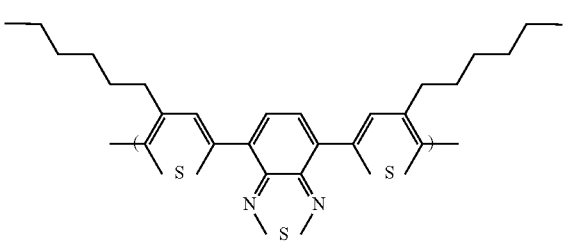

Each of the further repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality. Suitable repeat units for a functional region are as discussed above in relation to repeat units suitable for use in a semiconductive polymer having the same function.

The different regions within such a polymer may be provided along the polymer backbone, as per U.S. Pat. No. 6,353,083, or as groups pendant from the polymer backbone as per WO 01/62869.

When the semiconductive polymer comprises $T^1$, there may be no repeat units comprising nitrogen atoms in the repeat unit backbone other than $T^1$.

Referring to the third aspect of the present invention, the monomer may have general formula XXIII:

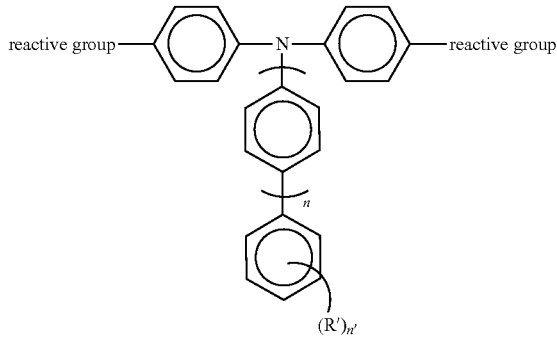

XXIII where R', n and n' are as defined in relation to the second aspect.

The monomer may have general formula XXIV:

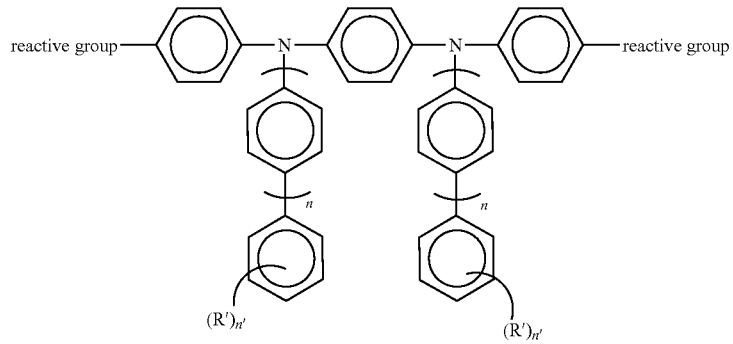

XXIV where R', n and n' are as defined in relation to the second aspect.

The monomer may have formula XXV to XXX:

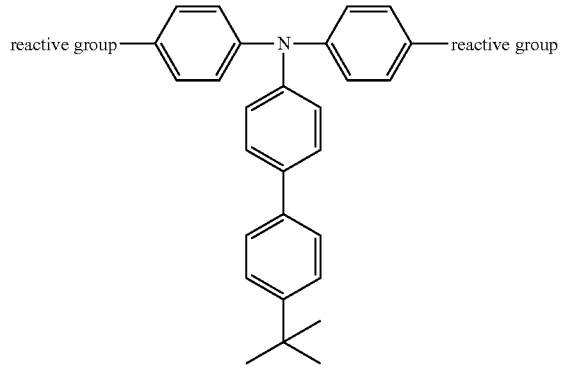

XXV

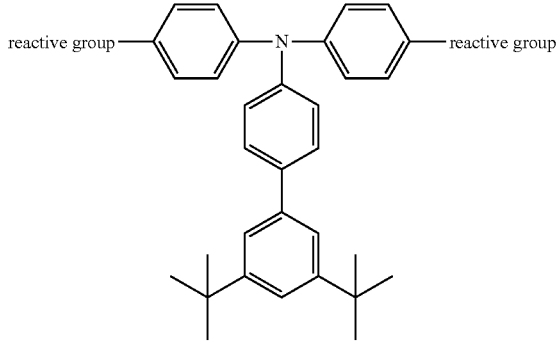

XXVI

-continued
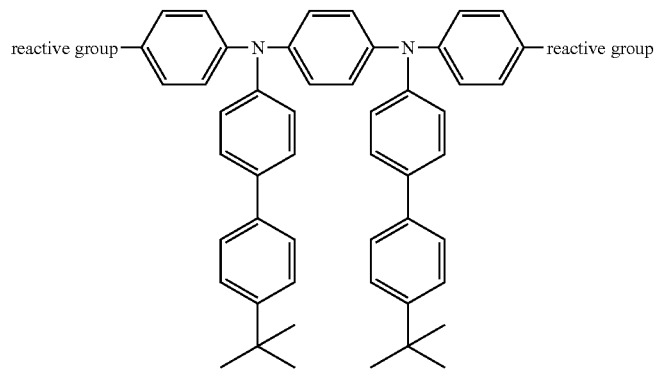
XXVII
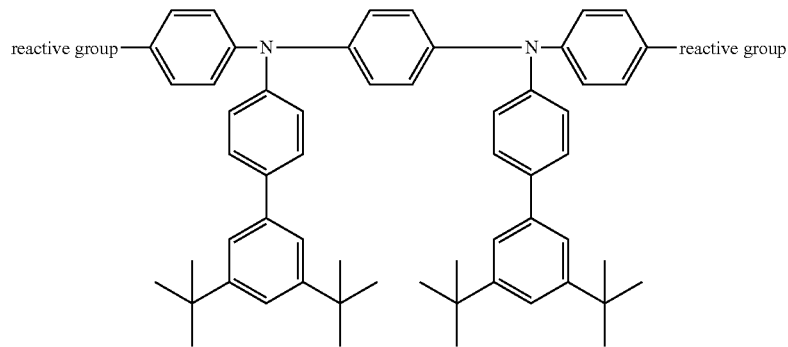
XXVIII
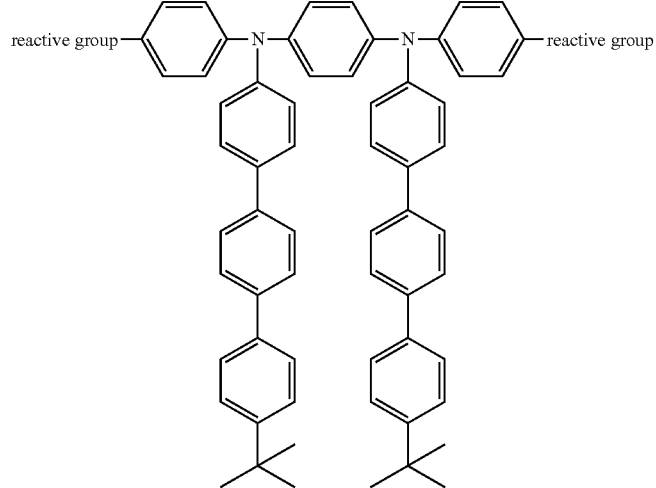
XXIX
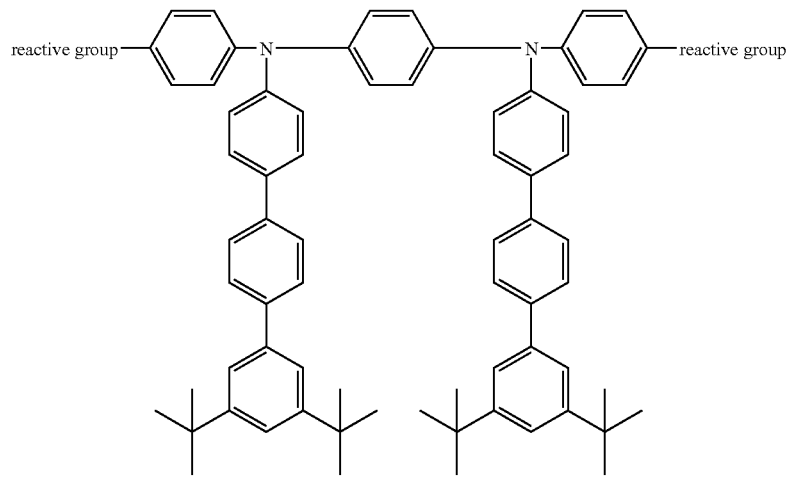
XXX

The reactive groups in formulae II and XXIII to XXX may be any reactive groups suitable for participation in polymerisation, for example reactive groups as defined anywhere below. Both reactive groups may be Br.

Preferred methods for preparation of a semiconductive polymer as defined in relation to the first aspect, optionally from a monomer according to the third aspect, are Suzuki polymerisation as described in, for example, WO 00/53656 and Yamamoto polymerisation as described in, for example, T. Yamamoto, "Electrically Conducting And Thermally Stable p—Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable reactive leaving group or groups. A repeat unit typically is derived from a monomer carrying two suitable reactive leaving groups.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

BRIEF DESCRIPTION OF THE DRAWINGS

The present invention now will be described in more detail with reference to the attached Figures, in which:—

DETAILED DESCRIPTION

According to the present invention, lifetime measurements are obtained at room temperature (295° K) by measuring the time taken for luminescence to decrease by half at a constant current.

The pulsed driven display of the first aspect may comprise a passive matrix display.

Figure 1:
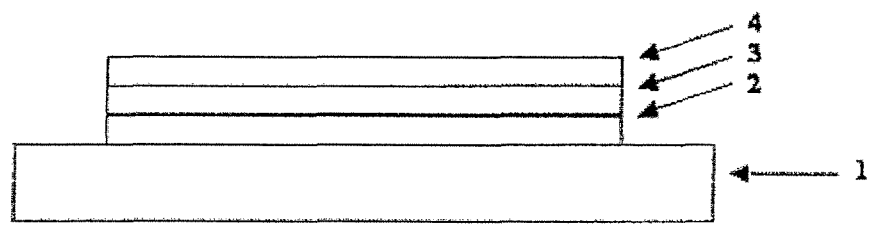
FIG. 1 shows the structure of a light-emitting device.
Figure 2:
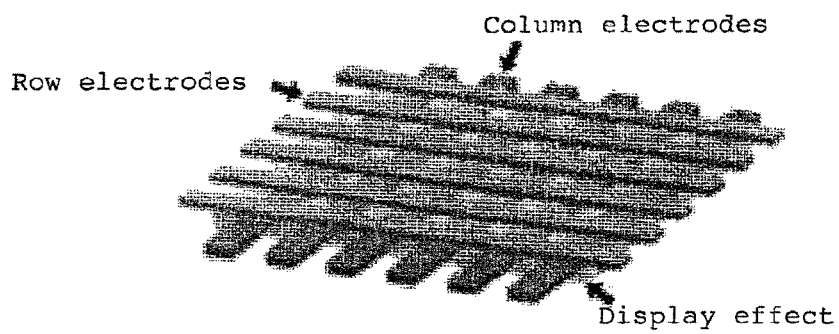
FIG. 2 shows a passive matrix device.
Figure 3:
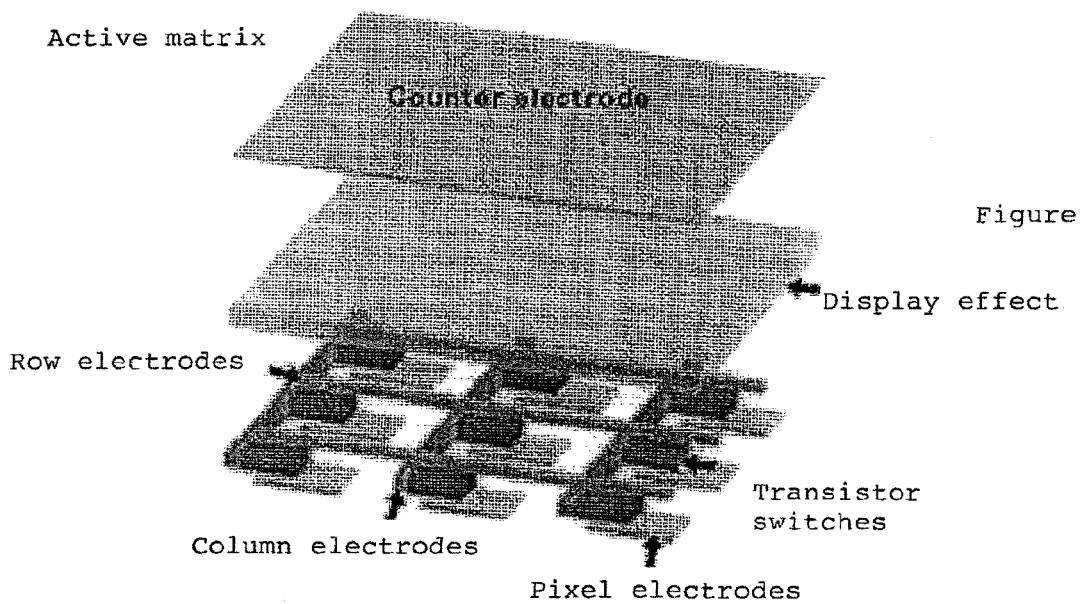
FIG. 3 shows an active matrix device.
Figure 4:
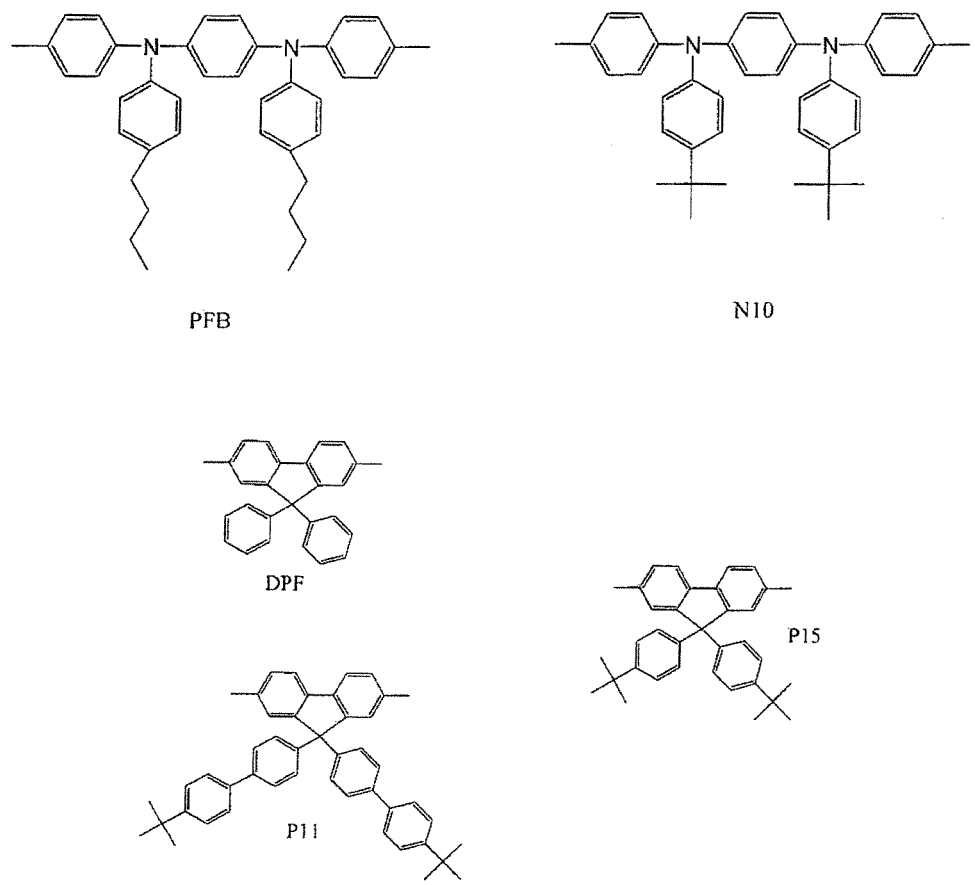
FIG. 4 shows the structures of "PFB", "N10", "DPF", "P11", and "P15".

With reference to FIG. 1, the LED comprised in the present pulsed driven display comprises a transparent glass or plastic substrate 1, an anode 2 of indium tin oxide and a cathode 4. An electroluminescent layer 3 is provided between anode 2 and cathode 4. Further layers may be located between anode 2 and cathode 3, such as charge transporting, charge injecting or charge blocking layers.

In particular, it is desirable to provide a conductive hole injection layer formed of a doped organic material located between the anode 2 and the electroluminescent layer 3 to assist hole injection from the anode into the layer or layers of semiconducting polymer. Examples of doped organic hole injection materials include poly(ethylene dioxythiophene) (PEDT), in particular PEDT doped with polystyrene sulfonate (PSS) as disclosed in EP 0901176 and EP 0947123, or polyaniline as disclosed in U.S. Pat. No. 5,723,873 and U.S. Pat. No. 5,798,170.

If present, a hole transporting layer located between anode 2 and electroluminescent layer 3 preferably has a HOMO level of less than or equal to 5.5 eV, more preferably around 4.8-5.5 eV. A semiconductive polymer comprising repeat unit $T^1$ and/or $F^1$ may be used as a hole transport material in a hole transporting layer (or indeed in an electroluminescent layer 3).

If present, an electron transporting layer located between electroluminescent layer 3 and cathode 4 preferably has a LUMO level of around 3-3.5 eV. A semiconductive polymer comprising repeat unit $F^1$ may be used as an electron transporting material in an electron transport layer (or indeed in an electroluminescent layer 3).

Electroluminescent layer 3 may consist of an electroluminescent material alone or may comprise an electroluminescent material in combination with one or more further materials. An electroluminescent material may be blended with hole and/or electron transporting materials as disclosed in, for example, WO 99/48160. Alternatively, the electroluminescent material may be covalently bound to a charge transporting material.

Suitable electroluminescent polymers for use in layer 3 include poly(arylene vinylenes) such as poly(p-phenylene vinylenes) and polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein. A semiconductive polymer comprising repeat unit $T^1$ and/or $F^1$ may be used as an electroluminescent material in layer 3.

Cathode 4 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of calcium and aluminium as disclosed in WO 98/10621, elemental barium disclosed in WO 98/57381, Appl. Phys. Lett. 2002, 81(4), 634 and WO 02/84759 or a thin layer of dielectric material to assist electron injection, for example lithium fluoride disclosed in WO 00/48258 or barium fluoride, disclosed in Appl. Phys. Lett. 2001, 79(5), 2001. In order to provide efficient injection of electrons into the device, the cathode preferably has a workfunction of less than 3.5 eV, more preferably less than 3.2 eV, most preferably less than 3 eV.

Light-emitting devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

In a practical device, at least one of the electrodes is semi-transparent in order that light may be emitted. Where the anode is transparent, it typically comprises indium tin oxide. Examples of transparent cathodes are disclosed in, for example, GB 2348316.

The embodiment of FIG. 1 illustrates a device wherein the device is formed by firstly forming an anode on a substrate followed by deposition of an electroluminescent layer and a cathode, however it will be appreciated that the device of the invention could also be formed by firstly forming a cathode on a substrate followed by deposition of an electroluminescent layer and an anode.

In the preparation of a display according to the first aspect, the semiconductive polymer may be deposited from solution to form a layer. Suitable solvents for polyarylenes, in particular polyfluorenes, include mono- or poly-alkylbenzenes such as toluene and xylene. Particularly preferred solution deposition techniques are spin-coating and inkjet printing.

Inkjet printing is particularly suitable for high information content displays, in particular full colour displays. Inkjet printing of OLEDs is described in, for example, EP 0880303.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

EXAMPLES

Light-emitting devices were constructed as follows:
Poly(ethylene dioxythiophene)/poly(styrene sulfonate) (PEDT/PSS), available from H C Starck of Leverkusen, Germany as Baytron P® was deposited over an indium tin oxide anode supported on a glass substrate (available from Applied Films, Colorado, USA) by spin coating. A hole transporting layer of F8-TFB (shown below) was deposited over the PEDT/PSS layer by spin coating from xylene solution to a thickness of about 10 nm and heated at 180° C. for 1 hour. Polymer 1, 2, 3, 4, 5, or 6 was deposited over the layer of F8-TFB by spin-coating from xylene solution to a thickness of around 65 nm. Then a Ba/Al cathode was formed over the polymer by evaporating a first layer of barium to a thickness of up to about 10 nm and a second layer of aluminium barium to a thickness of about 100 nm over the semiconducting polymer. Finally, the device was sealed using a metal enclosure containing a getter that is placed over the device and glued onto the substrate in order to form an airtight seal.

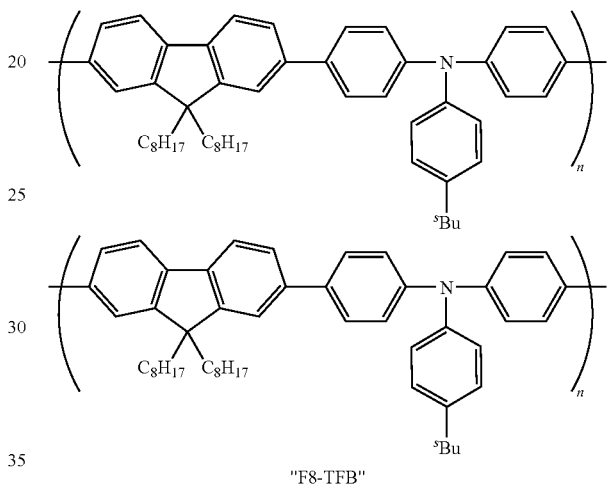

"F8-TFB"

The following polymers were used as emissive layers in the light-emitting devices:
1 (65% F8, 30% DPF, 5% PFB)
2 (65% F8, 30% DPF, 5% N10)
3 (50% F8, 30% DPF, 10% TFB 10% PFB)
4 (50% F8, 30% DPF, 10% TFB 10% N10)
5 (65% F8, 30% DPF, 5% PFB)
6 (65% F8, 30% DPF, 5% N10)

The dc and pulsed lifetimes were obtained at room temperature (295° K) by measuring the time taken for luminescence to decrease by half at a constant current. DC lifetimes were measured from a start luminescence of 800 cd/m2. Pulsed lifetimes were measured from a start luminescence of 14,000 cd/m2. For the pulsed lifetimes, the multiplex ratio (MUX) was 64 and the repeat frequency was 60 Hz.

Results are shown in Tables 1 to 3. The results clearly show that the pulsed lifetime increases when the polymer comprises a triarylamine repeat unit $T^1$ in accordance with the present invention as compared with the corresponding polymer comprising PFB or DPF, respectively.

TABLE 1

| Polymer | DC LT (hrs) | Pulsed LT (hrs) | Pulsed/DC LT |
|---------|-------------|-----------------|--------------|
| 1       | 48*         | 350             | 7.2          |
| 2       | 54*         | 601             | 11.1         |

TABLE 2

| Polymer | DC LT (hrs) | Pulsed LT (hrs) | Pulsed/DC LT |
|---|---|---|---|
| 3 | 5* | 99 | 19.8 |
| 4 | 5* | 339 | 67.8 |

TABLE 3

| Polymer | DC LT (hrs) | Pulsed LT (hrs) | Pulsed/DC LT |
|---|---|---|---|
| 5 | 40* | 386 | 9.6 |
| 6 | 56* | 575 | 10.3 |

*Extrapolated from 800 cd/m² (AF = 2)

The invention claimed is:

1. A pulsed driven display comprising a passive matrix organic light-emitting device, said device comprising an organic layer comprising a semiconductive polymer, said polymer comprising a fluorene or triarylamine repeat unit, the fluorene or triarylamine repeat unit having a group R pendent from the polymer backbone, wherein R has general formula I:

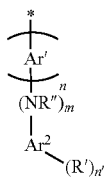

I where $Ar^1$ represents phenyl or a group comprising napthyl; $Ar^2$ represents phenyl or a group comprising napthyl; R' represents a substituent group; R"=H or a substituent; n=0, 1, 2 or 3; m=0 or 1; and n'=1 or 2, with the proviso that m=0 if n=0.

2. A display according to claim 1, wherein R' represents a branched C4 to C20 alkyl or alkoxy group.

3. A display according to claim 2, wherein R' represents t-Bu.

4. A display according to claim 1, wherein when n'=1 and $Ar^2$ represent phenyl, R' is located at the para position.

5. A display according to claim 1, wherein when n'=2 and $Ar^2$ represent phenyl, R' are located at the meta positions.

6. A display according to claim 1, wherein the polymer comprises a fluorene repeat unit having general formula VI:

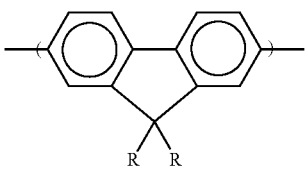

VI where each R independently is as defined in any one of the preceding claims.

7. A display according to claim 1, wherein the polymer comprises a triarylamine repeat unit comprising a triphenylamine.

8. A display according to claim 7, wherein the triarylamine repeat unit has general formula XIVa:

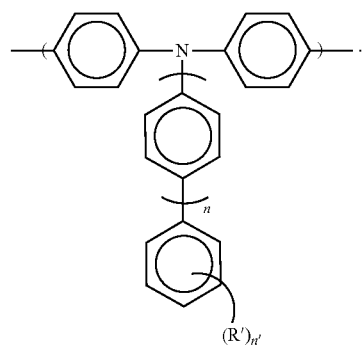

XIVa

9. A display according to claim 7, wherein the triarylamine repeat unit has general formula XIVb:

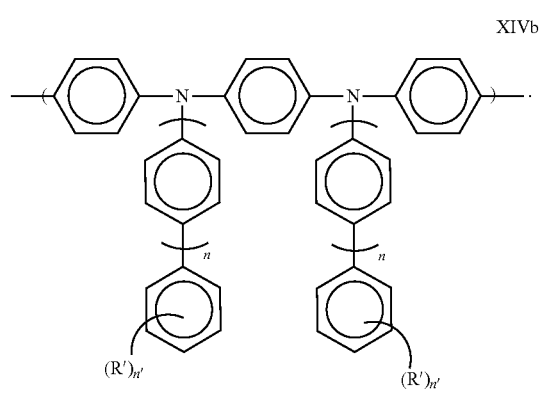

XIVb

10. A display according to claim 1, wherein the semiconductive polymer is blue light-emitting.

11. A display according to claim 1, wherein the semiconductive polymer is hole transporting.

12. A display according to claim 1, wherein the semiconductive polymer has at least one further repeat unit selected from the group consisting of 1,4-phenylene repeat units; indenofluorene repeat units; spirofluorene repeat units; 2,7-linked fluorene repeat units; triarylamine repeat units; and heteroarylene repeat units.

13. A method for preparing a display according to claim 1, comprising depositing the semiconductive polymer from solution to form a layer.

14. A pulsed driven display according to claim 1, wherein n'=2 and R' represents a branched C4 to C20 alkyl or alkoxy group comprising a tertiary carbon atom.

* * * * *